United States Patent
Zhang

(10) Patent No.: US 8,555,103 B2
(45) Date of Patent: Oct. 8, 2013

(54) DESKEWING APPARATUS FOR OSCILLOSCOPE

(75) Inventor: Jing-Chen Zhang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 384 days.

(21) Appl. No.: 13/092,970

(22) Filed: Apr. 24, 2011

(65) Prior Publication Data
US 2012/0169389 A1   Jul. 5, 2012

(30) Foreign Application Priority Data
Dec. 30, 2010   (CN) .......................... 2010 1 0614587

(51) Int. Cl.
*G06F 1/04*   (2006.01)
(52) U.S. Cl.
USPC ........................................................ 713/503
(58) Field of Classification Search
USPC .......................................... 713/503; 327/164
See application file for complete search history.

(56) References Cited

U.S. PATENT DOCUMENTS 7,557,662 B2 *   7/2009   Heike et al. ...................... 331/2

\* cited by examiner

*Primary Examiner* — Kim Huynh
*Assistant Examiner* — Alyaa T Mazyad
(74) *Attorney, Agent, or Firm* — Altis & Wispro Law Group, Inc.

(57) ABSTRACT

A deskewing apparatus includes a power supply connector, a oscillator, a first switch unit, a second switch unit, a first logic member, a second logic member, a clock generator and a plurality of output channels. The oscillator generates an electrical signal with a predetermined frequency and sinusoidal waveform. The first switch unit and the second switch unit each generates on/off signals by controlling power on/off. The first logic member and the second logic member generate logic signals according to the corresponding on/off signals from the first switch unit and the second switch unit. The clock generator multiplies the frequency of the electrical signal based on the combination of the logic signals and converting the electrical signal from sinusoidal waveform into rectangular waveform. The output channels output the converted electrical signal.

11 Claims, 1 Drawing Sheet

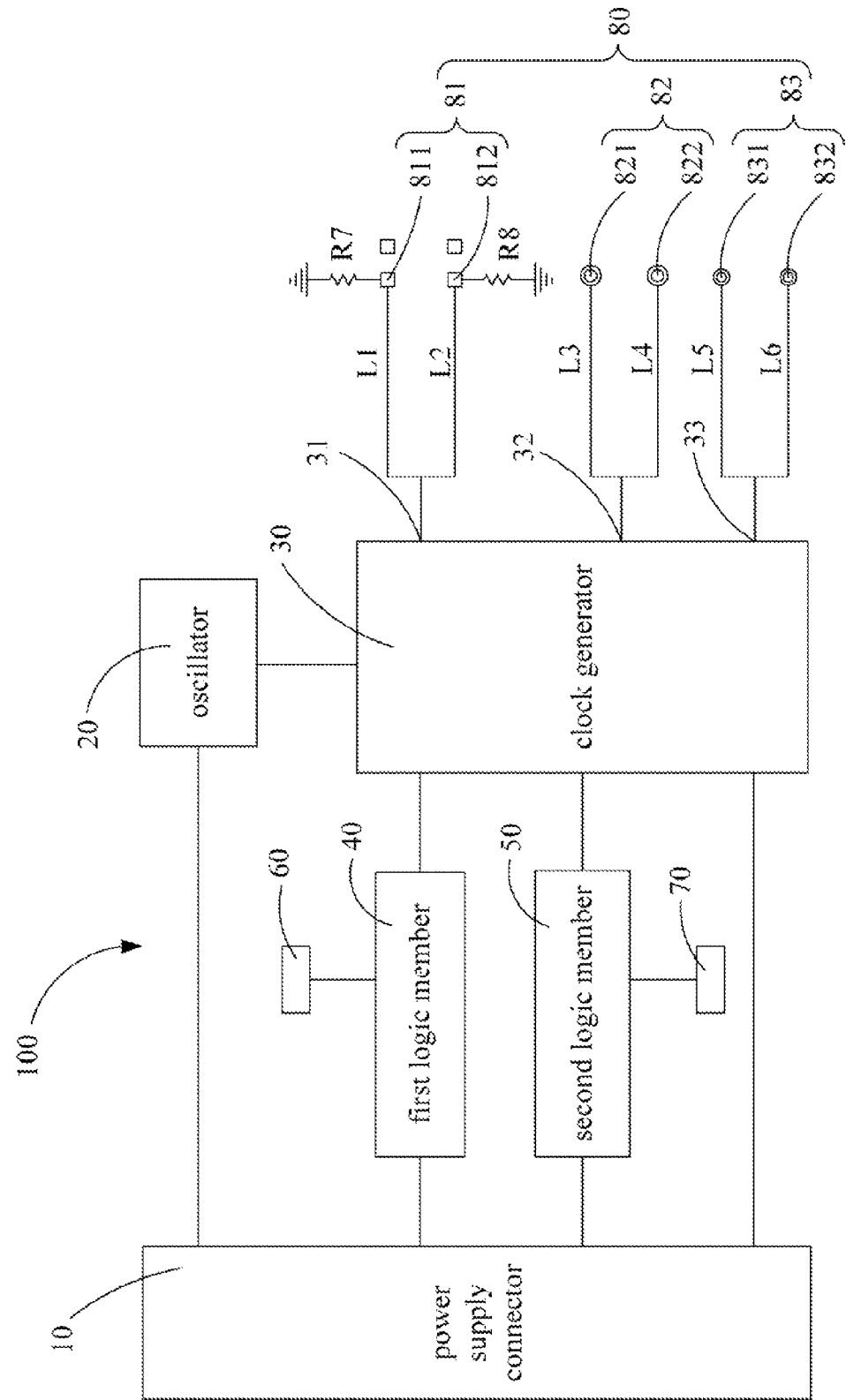

DESKEWING APPARATUS FOR OSCILLOSCOPE

BACKGROUND

1. Technical Field

The present disclosure relates to deskewing apparatuses, and particularly, to a deskewing apparatus for an oscilloscope.

2. Description of Related Art

An oscilloscope is a test instrument that allows observation of constantly varying signal voltages. The oscilloscope typically includes a number of signal channels and a number of probes respectively connected to the signal channels. Because of differences between different signal channels and different probes, signals passing through different signal channels and different probes may be delayed at different intervals, and time sequences of different signal channels and different probes may be differently deviated from each other.

An oscilloscope typically has a function for eliminating the differences between the time sequences of different signal channels and different probes. This function is called deskew in oscilloscopes. Current oscilloscope uses sinusoidal wave to correct the deviation between different time sequences, however, the waveform rise time of the sinusoidal wave usually lasts several microseconds, the waveform rise speed is slow relative to the faster and faster transmitting speed of signals, therefore, the deskew effect of the oscilloscope is not satisfied.

What is needed therefore is a deskewing apparatus for an oscilloscope addressing the limitations described.

BRIEF DESCRIPTION OF THE DRAWINGS

The FIGURE shows function blocks of a deskewing apparatus, according to an exemplary embodiment of the present disclosure.

DETAILED DESCRIPTION

Referring to the FIGURE, a deskewing apparatus 100, according to an exemplary embodiment, is shown. The deskewing apparatus 100 includes power supply connector 10, an oscillator 20, a clock generator 30, a first logic member 40, a second logic member 50, a first switch unit 60, a second switch 70, and a number of output channels 80. The oscillator 20, the first logic member 40, the second logic member 50 and the output channels 80 are electrically connected to the clock generator 30. The first switch unit 60 is electrically connected to the first logic member 40, and the second switch unit 70 is electrically connected to the second logic member 50.

The power supply connector 10 is configured for connecting to a power supply of an oscilloscope (not shown) to provide electrical power for the deskewing apparatus 100. In this embodiment, the power supply connector 10 is a Universal Serial Bus (USB) connector.

The oscillator 20 is configured for generating an electrical signal with predetermined frequency and sinusoidal waveform and sending the electrical signal to the clock generator 30.

The first switch unit 60 and the second switch unit 70 both are configured for generating on/off signals by controlling their power on/off. The first switch unit 60 and the second switch unit 70 send the on/off signals to the first logic member 40 and the second logic member 50, respectively.

The first logic member 40 and the second logic member 50 are configured for generating logic signals upon receipt of the corresponding on/off signals from the first switch unit 60 and the second switch unit 70, and transmitting the logic signals to the clock generator 30. In this embodiment, if the first switch unit 60 is powered on, the output of the first logic member 40 is 0, if the first switch unit 60 is powered off, the output of the first logic member 40 is 1. Similarly, if the second switch unit 70 is powered on, the output of the second logic member 50 is 0, if the second switch unit 70 is powered off, the output of the second logic member 50 is 1.

The clock generator 30 is configured for multiplying the frequency of the electrical signal based on the combination of the output of the first logic member 60 and the second logic member 70, and converting the electrical signal from sinusoidal waveform into rectangular waveform. In this embodiment, if the output of the first logic member 40 and the second logic member 50 are 0, the clock generator 30 multiples the frequency of the electrical signal four times; if the output of the first logic member 40 is 0, the output of the second logic member 50 is 1, the clock generator 30 multiples the frequency of the electrical signal five times; if the output of the first logic member 40 is 1, the output of the second logic member 50 is 0, the clock generator 30 multiples the frequency of the electrical signal six times; if the output of the first logic member 40 and the second logic member 50 are 1, the clock generator 30 multiples the frequency of the electrical signal eight times. The clock generator 30 includes three output terminals 31, 32, 33, each of the output terminals 31, 32, 33 can output the electrical signal with rectangular waveform.

In other embodiments, the number of the logic member and the corresponding switch unit can be more than two, and the number of the output terminal is not restricted at three.

The output channels 80 include a 3.5 mm connector unit 81, a subminiature version A (SMA) connector unit 82 and a subminiature push-on (SMP) connector unit 83. The 3.5 mm connector unit 81 includes a first 3.5 mm connector 811 and a second 3.5 mm connector 812 each for connecting to a 3.5 mm probe (not shown). The first 3.5 mm connector 811 and the second 3.5 mm connector 812 are connected to the output terminal 31 respectively by transmitting lines L1 and L2, the transmitting lines L1 and L2 are made from the same material(s) and have the same size. The 3.5 mm connector 81 further includes two resistors R7 and R8, the resistor R7 is connected to the first 3.5 mm connector 811, and the resistor R8 is connected to the second 3.5 mm connector 812. Both resistances of the resistors R7, R8 are 50 Ohms.

The SMA connector unit 82 includes a first SMA connector 821 and a second SMA connector 822 each for connecting to a SMA probe (not shown). The first SMA connector 821 and the second SMA connector 822 are connected to the output terminal 32 respectively by transmitting lines L3 and L4, the transmitting lines L3 and L4 are made from the same material(s) and have the same size.

The SMP connector unit 83 includes a first SMP connector 831 and a second SMP connector 832 each for connecting to a SMP probe (not shown). The first SMP connector 831 and the second SMP connector 832 are connected to the output terminal 33 respectively by transmitting lines L5 and L6, the transmitting lines L5 and L6 are made from the same material(s) and have the same length.

In this embodiment, the transmitting lines L1, L2, L3, L4, L5 and L6 are made from the same material(s) and have the same length.

In use, the power supply connector 10 is connected to a power supply of an oscilloscope (not shown). The oscillator 20 generates an electrical signal with predetermined frequency and sinusoidal waveform, sends the electrical signal to the clock generator 30. The first logic member 40 and the second logic member 50 output logic signals respectively according to the on/off signals of the first switch unit 60 and the second switch unit 70. The clock generator 30 receives the electrical signal, multiplies the frequency of the electrical signal according to the combination of the logic signals of the first logic member 40 and the second logic member 50, and converts the electrical signal from sinusoidal waveform into rectangular waveform. The clock generator 30 can output the converted electrical signal through the output terminals 31, 32, 33, the output electrical signal transmits to the 3.5 mm connector unit 81 through the transmitting lines L1, L2, to the SMA connector unit 82 through the transmitting lines L3, L4, and to the SMP connector unit 83 through the transmitting line L5, L6, then, the electrical signal can be transmitted to corresponding probes (not shown).

The deskewing apparatus 100 uses an electrical signal with high frequency and rectangular waveform to correct the skew of the oscilloscope, the rectangular wave has very short waveform rise time (about 500 ps), therefore can improve the deskew effect of the oscilloscope. Furthermore, the electrical signal transmits to the output channels 80 through the same transmitting lines, thus can ensure the original time sequences of different output channels 80 the same.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A deskewing apparatus for an oscilloscope, comprising:
    a power supply connector configured for electrically connecting the oscilloscope to the deskewing apparatus and providing electrical power for the deskewing apparatus;
    an oscillator configured for generating an electrical signal with a predetermined frequency and sinusoidal waveform;
    a first switch unit and a second switch unit each configured for generating on/off signals by controlling power on/off;
    a first logic member electrically connected to the first switch unit, and a second logic member electrically connected to the second switch unit, the first logic member and the second logic member being configured for generating logic signals according to the corresponding on/off signals from the first switch unit and the second switch unit;
    a clock generator electrically connected to the oscillator, the first logic member and the second logic member, the clock generator being configured for multiplying frequency of the electrical signal based on the combination of the logic signals of the first logic member and the second logic member, and converting the electrical signal from the sinusoidal waveform into a rectangular waveform; and
    a plurality of output channels electrically connected to the clock generator for outputting the converted electrical signal.

2. The deskewing apparatus of claim 1, wherein the power supply connector is a Universal Serial Bus connector.

3. The deskewing apparatus of claim 1, wherein when the first switch unit is powered on, the output of the first logic member is 0, when the first switch unit is powered off, the output of the first logic member is 1, when the second switch unit is powered on, the output of the second logic member is 0, when the second switch unit is powered off, the output of the second logic member is 1.

4. The deskewing apparatus of claim 3, wherein if the output of the first logic member and the second logic member are 0, the clock generator multiples the frequency of the electrical signal four times; if the output of the first logic member is 0, the output of the second logic member is 1, the clock generator multiples the frequency of the electrical signal five times; if the output of the first logic member is 1, the output of the second logic member is 0, the clock generator multiples the frequency of the electrical signal six times; if the output of the first logic member and the second logic member are 1, the clock generator multiples the frequency of the electrical signal eight times.

5. The deskewing apparatus of claim 1, wherein the clock generator comprises three output terminals, each of the output terminals is configured for output the converted electrical signal with rectangular waveform.

6. The deskewing apparatus of claim 5, the output channel unit comprises a 3.5 mm connector unit, a subminiature version A connector unit and a subminiature push-on connector unit, each of the 3.5 mm connector, the subminiature version A connector unit and the subminiature push-on connector are correspondingly connected to an output terminal.

7. The deskewing apparatus of claim 6, wherein the 3.5 mm connector unit comprises a first 3.5 mm connector and a second 3.5 mm connector, the first 3.5 mm connector and the second 3.5 mm connector are connected to the corresponding output terminal respectively by two same transmitting lines.

8. The deskewing apparatus of claim 7, wherein the 3.5 mm connector comprise two resistors, one resistor is connected to the first 3.5 mm connector, and the other resistor is connected to the second 3.5 mm connector.

9. The deskewing apparatus of claim 8, wherein both the resistance of the resistors are about 50 Ohms.

10. The deskewing apparatus of claim 6, the subminiature version A connector unit comprises a first subminiature version A connector and a second subminiature version A connector, the first subminiature version A connector and the second subminiature version A connector are connected to the corresponding output terminal respectively by two same transmitting lines.

11. The deskewing apparatus of claim 6, the subminiature push-on connector unit comprises a first subminiature push-on connector and a second subminiature push-on connector, the first subminiature push-on connector and the second subminiature push-on connector are connected to the corresponding output terminal respectively by two same transmitting lines.

* * * * *